(12) United States Patent
Wang

(10) Patent No.: US 9,268,885 B1
(45) Date of Patent: Feb. 23, 2016

(54) INTEGRATED CIRCUIT DEVICE METHODS AND MODELS WITH PREDICTED DEVICE METRIC VARIATIONS

(71) Applicant: MIE Fujitsu Semiconductor Limited, Kuwana (JP)

(72) Inventor: Jing Wang, San Jose, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 144 days.

(21) Appl. No.: 13/780,006

(22) Filed: Feb. 28, 2013

(51) Int. Cl.
*G06F 17/50* (2006.01)
(52) U.S. Cl.
CPC .................................. *G06F 17/5009* (2013.01)
(58) Field of Classification Search
CPC .................................................. G06F 17/5009
USPC .................. 716/106, 107, 111, 112, 113, 136
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |

(Continued)

FOREIGN PATENT DOCUMENTS

| EP | 0274278 A1 | 7/1988 |
|---|---|---|
| EP | 0312237 A2 | 4/1989 |

(Continued)

OTHER PUBLICATIONS

English Translation of JP 8153873 Submitted herewith.

(Continued)

*Primary Examiner* — Vuthe Siek
(74) *Attorney, Agent, or Firm* — Baker Botts L.L.P.

(57) ABSTRACT

A method can include selecting integrated circuit (IC) device fabrication process source variations; generating relationships between each process source variance and a device metric variance; and calculating at least one IC device metric value from the process source variations and corresponding relationships between each process source variance and a device metric variance.

12 Claims, 9 Drawing Sheets

(56) References Cited

U.S. PATENT DOCUMENTS

| | | |
|---|---|---|
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,330,526 B1 | 12/2001 | Yasuda |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,606,729 B2 | 8/2003 | Gross et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,698,000 B2 | 2/2004 | Tanaka |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,795,800 B1 | 9/2004 | Lee |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,850,877 B1 | 2/2005 | Sengupta |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,901,570 B2 | 5/2005 | Lu |
| 6,916,698 B2 | 7/2005 | Mocuta et al. |
| 6,917,237 B1 | 7/2005 | Tschanz et al. |

(56) References Cited

U.S. PATENT DOCUMENTS

| | | |
|---|---|---|
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |

(56) References Cited

U.S. PATENT DOCUMENTS

| | | |
|---|---|---|
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,937,252 B2 | 5/2011 | Onodera et al. |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,165,845 B1 | 4/2012 | Seebeck et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,204,714 B2 | 6/2012 | Lu |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 8,423,341 B2 | 4/2013 | Lu |
| 2001/0014495 A1 | 8/2001 | Yu |
| 2001/0034595 A1* | 10/2001 | Yamaguchi ............... 703/19 |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0056877 A1 | 3/2005 | Rueckes et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. |
| 2006/0150129 A1* | 7/2006 | Chiu et al. ............... 716/4 |
| 2006/0154428 A1 | 7/2006 | Dokumaci |
| 2006/0157794 A1 | 7/2006 | Doyle et al. |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0138953 A1 | 6/2008 | Challa et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0057746 A1 | 3/2009 | Sugll et al. |
| 2009/0057762 A1 | 3/2009 | Bangsaruntip et al. |
| 2009/0108350 A1 | 4/2009 | Cai et al. |
| 2009/0121298 A1 | 5/2009 | Furukawa et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0262414 A1 | 10/2010 | Joshi et al. |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |

(56) References Cited

U.S. PATENT DOCUMENTS

| | | |
|---|---|---|
| 2011/0093242 A1 | 4/2011 | Lu |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0056502 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Banerjee et al., "Compensating Non-Optical Effects using Electrically-Driven Optical Proximity Correction", Proc. of SPIE, vol. 7275, 2009.

Cheng et al., "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

Noda, K et al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3' 1998, pp. 1-19.

Wann, C. et al., "Channel Profile Optimization and Device Design for Low-Power High-Performance Dynamic-Threshold MOSFET", 1996, IEDM 96, pp. 113-116.

Werner, P. et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, vol. 87, No. 4, pp. 537-570.

Machine Translation of KR 10-0794094 Submitted herewith.

* cited by examiner

```
                      772                                        770
                        \                                       /
  //Netlist
     ┊
   module ckt_sample (in1, in2, in3, in4, out1)
   (nfet)(width(.50um), length(45nm))
         (*library = 'SVLTA_lib'; *)
      M0 (gate1=net1, drain=net2, source=net3, gate2=gnd!)
     ┊
   (pfet)(width(1um), length(45nm))
         (*library = 'SVLTA_lib'; *)
      M1 (gate1=net2, drain=net3, source=net4, gate2=Vpos)
     ┊
                        774
```

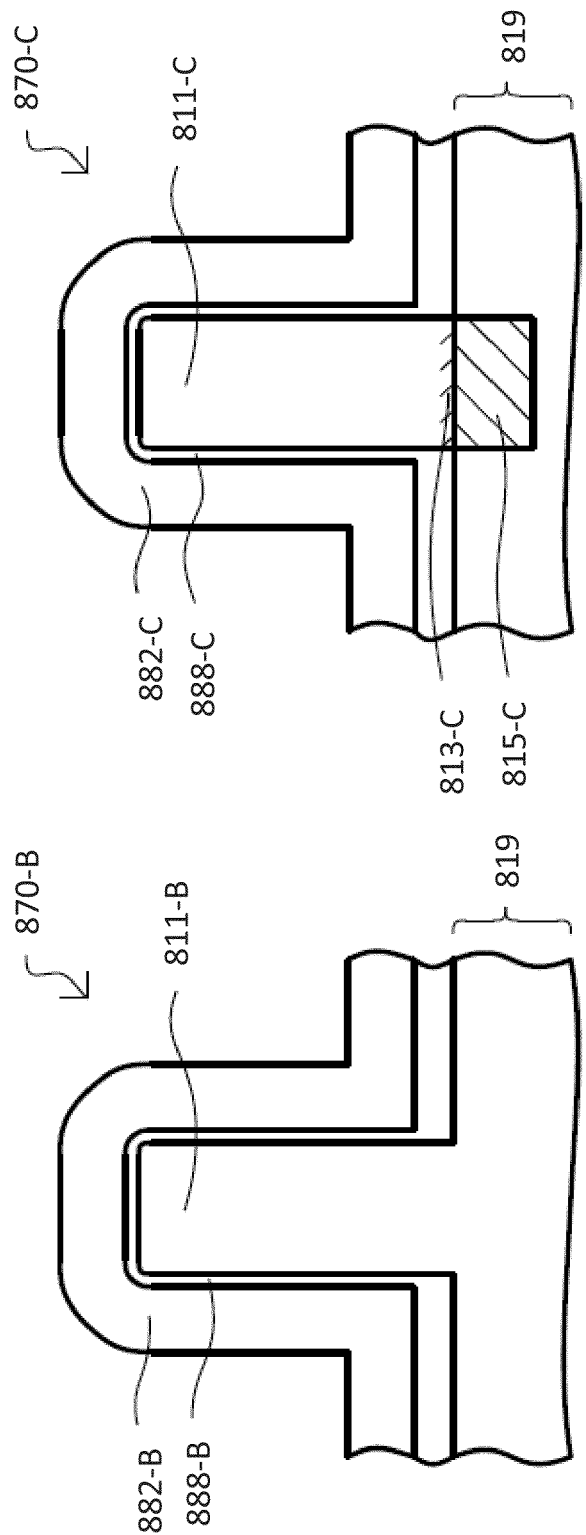

INTEGRATED CIRCUIT DEVICE METHODS AND MODELS WITH PREDICTED DEVICE METRIC VARIATIONS

TECHNICAL FIELD

This disclosure relates generally to integrated circuit design and modeling, and more particularly to generating predicted device performance metrics from assumed variations in fabrication process steps or results.

BACKGROUND

Conventional integrated circuit (IC) design methods utilize "hardware-based" approaches to predict device metrics (such as transistor performance metrics). For example, performance data can be collected from various dies on a number of fabricated wafers and then analyzed. Based on such analysis, models (e.g., transistor models) can then be created, which can serve as basis for simulating circuit behavior.

Such conventional approaches can suffice for mature fabrication processes. However, for processes still under development, such hardware data is generally unreliable as fabrication steps can be subject to change or the fabrication process drifts, making the initial metrics inaccurate thereby necessitating multiple rounds of design as the circuit behaviors evolve with the progression of the process development. Also, conventional approaches may only present performance data, making it difficult to obtain comprehensive information on how the sources of particular process variations can impact different device metrics.

Fabricated IC devices tend to encounter failures or underperforming components due to fabrication process variations, for instance, variations in threshold voltage. As a result, designers may elect to design conservatively, that is, to a wider set of process corners for the sake of ensuring a robust design but then sacrificing certain design targets. As semiconductor process advances to support Moore's law, the challenges of designing ICs in the context of process development only increase as the processes become more complex and therefore difficult to develop and implement. Design compensations for the ever-widening corners only increase. The trend continues with putting more and more burdens on design teams to tape out new chip products with satisfactory designs and meeting timelines for customers.

BRIEF DESCRIPTION OF THE DRAWINGS

FIGS. 8A to 8C are diagrams of transistors for which device metrics can be generated, according to various embodiments.

DETAILED DESCRIPTION

Various embodiments of the present invention will now be described in detail with reference to a number of drawings. The embodiments show methods to generate predicted integrated circuit (IC) device metrics from assumed process variations, to reliably model circuit behaviors in circuit simulators (e.g., SPICE) even during the course of a fabrication process that is in-development. Embodiments can enable designs by way of utilizing statistically derived relationships between metrics and/or process variations, including but not limited to: the impact of individual source variations on each device metric; correlations between different device metrics; and correlations between different device types.

Figure 1:
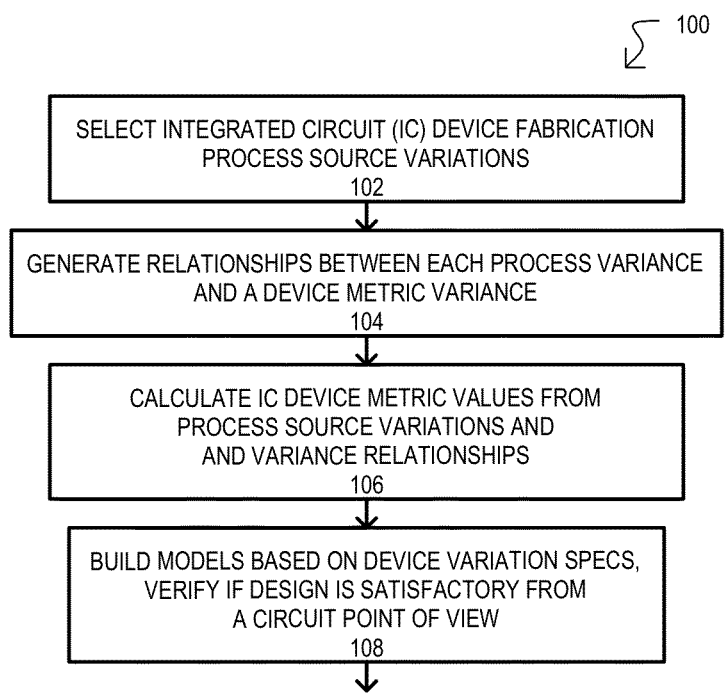
FIG. 1 is a flow diagram of a method according to an embodiment.

FIG. 1 shows a method 100 according to an embodiment. A method 100 can include selecting IC device fabrication process source variations (102). Process source variations usually refer to process targets relevant to behavior of fabricated components that can vary based upon variation of corresponding fabrication process steps. Note that while process source variations can include front-end processes for active (i.e., transistor) and passive (e.g., resistor, varactors) device fabrication, such values can also include variations resulting other process steps, including but not limited to interconnect metallization process steps or back-end processes (e.g., interconnect and/or packaging steps and/or variations).

In very particular embodiments, the process source variations can include transistor related source variations, including but not limited to: gate length (Lgate); gate insulator thickness (Tox); effective channel width (Weff); ion implantation energy and dose for threshold voltage adjustment (Vt dosage); Halo (or pocket)-implant dose; lightly doped drain (LDD) ion implant dose; transistor spacer thickness; and other fabrication steps targeting specific dimensions or concentrations and profiles to achieve a pre-selected transistor design. In addition or alternatively, source variations can include interconnect related variations that could impact other aspects of a resulting circuit, including but not limited to: chemical mechanical polishing (CMP) planarization; via and interlayer dielectric (ILD) thickness; interconnect metal thickness; interconnect metal width; via and contact size; and other fabrication steps specific to creating pre-selected structures to achieve pre-selected circuit elements with interconnected transistors. Still further, process source variations can include package related variations, including but not limited to: wiring inductance; wiring resistance; and pad-bond resistance.

It is understood that these listed values are provided by way of example only. Any suitable IC production effects can be included as a process source variation.

While the process source variation are described herein in reference to transistor structures and in particular, MOS type field effect transistors (FETs), alternate embodiments can include process source variation for other device types, including but not limited to bipolar junction transistors, junction FETs, finFETs or any other suitable active device.

In some embodiments, process source variations can be assumed from the expected fabrication process.

A method 100 can also include generating relationships between each process variance and a device metric variance (104). Such an action can include generating a value that reflects the extent to which each selected process source variations can affect a desired device metric. Such a relationship value can be expressed as the derivative of metric variance to source variance (∂M/∂P). In general, the relationship values for given process source variations can be extracted using one or more Technology Computer Aided Design (TCAD) tools.

Device metric values can represent any suitable IC device performance characteristic. In very particular embodiments, the device metric values are for representative transistor behaviors, including but not limited to: linear region threshold voltage (Vtlin), linear region drain current (Idlin); saturation region threshold voltage (Vtsat); drain induced barrier lowering (DIBL) effect; saturation drain current (Idsat); sub-threshold swing at saturation (Sssat); effective drain current (Ieff); gate capacitance (Cgg); and overlap capacitance (Cov) for a given transistor design and type. In addition or alternatively, device metrics can include interconnect related parameters, including but not limited to: via resistance (Rvia); inter-level capacitance (capacitance between lines of different layers, Ginter); and intra-level capacitance (capacitance between lines of same layer, Cintra).

Method 100 further includes calculating IC device metric specification values from the process source variations and the variance relationships (106). Such a calculation preferably uses a root-sum square mathematical formula as follows:

$$\Delta M_i = \sqrt{\sum_j \left(\frac{\partial M_i}{\partial P_j}\right)^2 (\Delta P_j)^2}$$

Where $\partial M_i/\partial P_j$ is the derivative relationship between device metric value in relation to given process, for instance, the device metric of threshold voltage as affected by threshold voltage-setting implant condition, and can generally be obtained by a pre-modeled computer program such as technology computer aided design (TCAD); and $\Delta P_j$ represents each of the sources of process variations affecting the behavior of the fabricated transistor, for instance, drawn gate-length, thickness of gate dielectric, etc.

Once the calculation is performed and the device metric value $\Delta M_i$ is obtained for a given set of conditions, the device metric value can be used to create transistor models 108 for circuit simulation for verifying circuit designs, for instance, in SPICE. The device metric value $\Delta M_i$ is preferably determined for various process variation cases, so that the calculated device metric value $\Delta M_i$ represents the middle as well as device corner values. Calculated device metric values can therefore be used to for simulation models to enable evaluation of circuit designs, or can be used with existing circuit designs to evaluate the transistor device design itself, and can enable the evaluation of the semiconductor process from which the process source variations are obtained, all using modeling techniques, thereby alleviating the need to run large amounts of silicon wafers.

Figure 2:
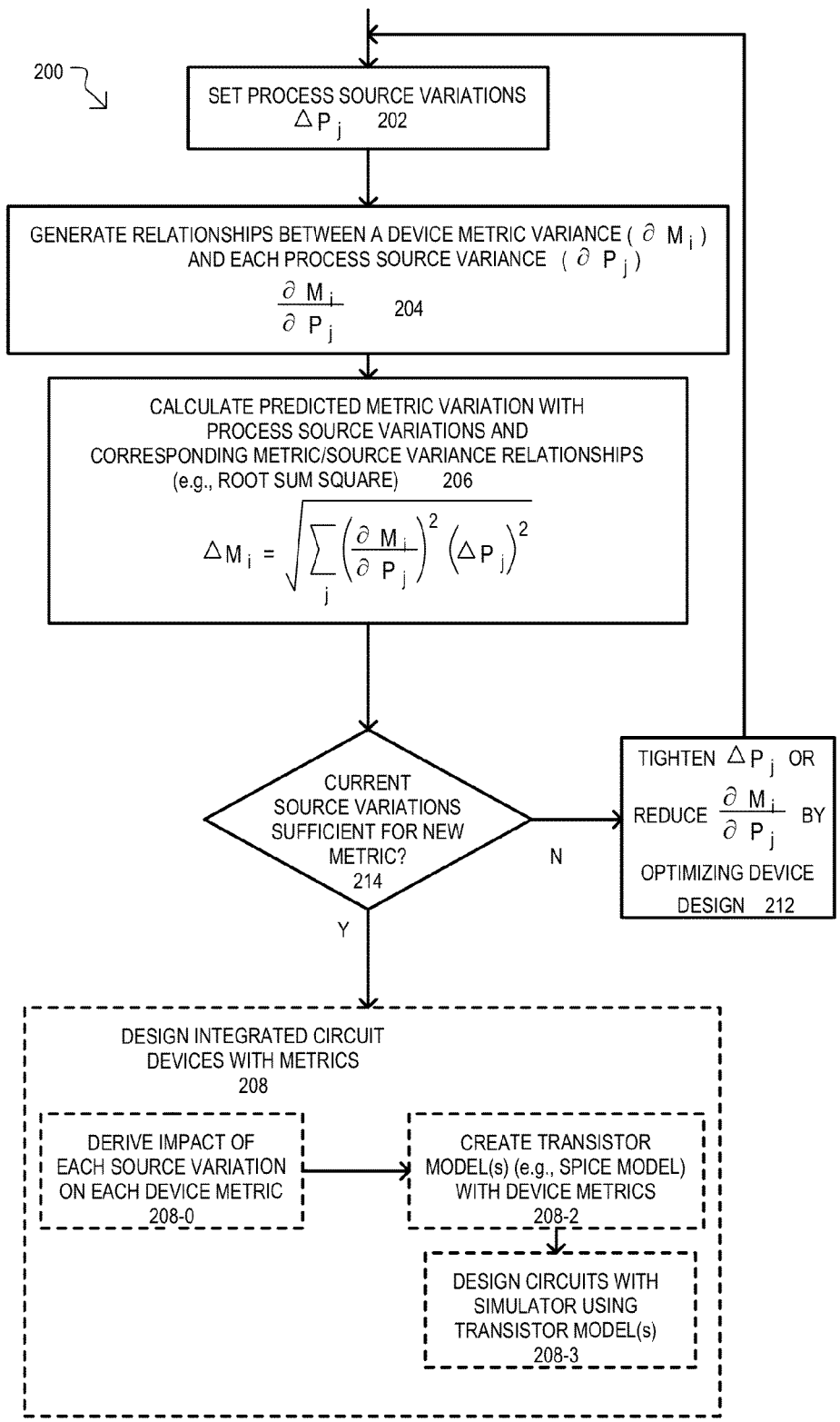
FIG. 2 is a flow diagram of a method according to another embodiment.

FIG. 2 is a flow diagram of a method (200) according to a further embodiment. A method 200 can include providing process source variations ($\Delta P_j$) (202). Process source variations ($\Delta P_j$) normally have a Gaussian distribution and the sigma values of the distributions can be obtained from the fabrication process assumptions.

Method 200 can include generating relationships between a device metric variance and each corresponding process source variance ($\partial M_i/\partial P_j$) (204). In general, variance relationships ($\partial M_i/\partial P_j$) can be extracted from a tool, such as TCAD, as but one example.

Method 200 then calculates a metric variation ($\Delta M_i$) with the selected process source variations and corresponding variance relationships (206), preferably by applying the root sum of squares formula at 206. Method 200 can then proceed to a checkpoint to determine if the input current process source variations are sound, in other words, sufficient to calculate a next device metric variation (Y from 214). Such an action can be based on a check of a calculated device metric $\Delta M_i$ against a predetermined set of target device metrics. If the process source variations are sufficient, then method 200 returns to box 204 to generate new variance relationships to calculate another device metric. If the current process source variations are not sufficient to calculate a next device metric variation (N from 214), a method 200 can return to box 202 to setup data values 212 for the process source variations necessary to generate the new device metric variation.

Once all desired device metrics have been generated (Y from 210), an integrated circuit device can be designed using the predicted device metric variations 208. It is understood that then, any suitable design steps can be taken from the predicted device metric variations.

As one example of an implementation of the process of FIG. 2, there is generated at Table 1 a set of parameters for $\partial M_i$ and for $\partial P_j$ for an exemplary DDC transistor (further described below) in a 28 nm process node for a nominal drawn gate length of 36 nm. Example process variations sources identified are, L (gate length), Tox (gate oxide thickness), ΔEpi (epitaxial layer) thickness, ΔScreen D dose (further described below), LDD D (source/drain extension) implant dosage, Spacer 1 (first sidewall spacer) thickness, Spacer 2 (second sidewall spacer) thickness, and W (FET channel width). Related and corresponding device metrics include Vtlin, Idlin, Vtsat, DIBL, Idsat, SSat, Ieff, Cgg and Coy (all described above).

TABLE 1

| | Process Variation Source (σP_j) | | | | | | | |
|---|---|---|---|---|---|---|---|---|
| σM_i | L [/nm] | Tox [/Å] | ΔEpi [/Å] | ΔScreen D: [/%] | LDD D [/%] | Spacer 1 [/nm] | Spacer 2 [/nm] | *W [/nm] |
| Vtlin [mV/] | 8.80 | 22.00 | 3.20 | −2.80 | −0.50 | 22.00 | 0.50 | 0.07 |
| Idlin [%/] | −1.60 | −5.80 | −0.82 | 0.68 | 0.29 | −16.30 | −0.28 | 0.17 |
| Vtsat [mV/] | 12.80 | 18.00 | 3.70 | −3.00 | −0.60 | 32.00 | 1.00 | 0.07 |
| DIBL [mV/] | −4.00 | 4.00 | −0.50 | 0.20 | 0.10 | −10.00 | −0.50 | 0.00 |
| Idsat [%/] | −3.46 | −8.70 | −1.37 | 1.02 | 0.34 | −19.20 | −0.36 | 0.17 |
| SSsat [mV/] | −0.21 | 1.44 | 0.07 | −0.02 | 0.02 | −0.75 | 0.00 | 0.00 |
| Ieff [%/] | −4.10 | −10.90 | −1.61 | 1.27 | 0.36 | −20.00 | −0.38 | 0.17 |
| Cgg [%/] | 1.50 | −2.80 | −0.02 | 0.01 | 0.01 | −1.90 | 0.03 | 0.17 |
| Cov [%/] | −0.14 | −0.66 | −0.11 | 0.05 | 0.06 | −6.55 | 0.03 | 0.17 |
| Vtlin [mV/] | 8.80 | 22.00 | 3.20 | −2.80 | −0.50 | 22.00 | 0.50 | 0.07 |

The derived numbers above, as well as estimated $\Delta P_j$ are then used in the process at Step 206 to result in device metric variations calculated as a root sum square value. An example of a result of applying Step 206 is at Table 2 below.

TABLE 2

| | Process Variation Source ($\Delta P_i$) | | | | | | | | |
|---|---|---|---|---|---|---|---|---|---|
| $\Delta M_i$ | $\Delta L$: 2 nm | $\Delta Tox$: 7Å | $\Delta Epi$: 10Å | $\Delta Screen$ D: 5% | $\Delta LDD$ D: 5% | $\Delta Spacer\ 1$: 0.6 nm | $\Delta Spacer\ 2$: 2 nm | *$\Delta W$: 5 nm | Total (RSS) |
| Vtlin [mV] | 17.60 | 15.40 | 16.00 | −28.00 | −2.50 | 13.20 | 1.00 | 0.34 | 42.05 |
| Idlin [%] | −3.20 | −4.06 | −4.10 | 6.80 | 1.45 | −9.78 | −0.56 | 0.83 | 13.73 |
| Vtsat [mV] | 25.60 | 12.60 | 18.50 | −30.00 | −3.00 | 19.20 | 2.00 | 0.34 | 49.38 |
| DIBL [mV] | −8.00 | 2.80 | −2.50 | 2.00 | 0.50 | −6.00 | −1.00 | 0.00 | 10.92 |
| Idsat [%] | −6.92 | −6.09 | −6.85 | 10.20 | 1.70 | −11.52 | −0.72 | 0.83 | 19.31 |
| SSsat [mV] | −0.42 | 1.01 | 0.36 | −0.15 | 0.09 | −0.45 | 0.01 | 0.00 | 1.25 |
| leff [%] | −8.20 | −7.63 | −8.05 | 12.70 | 1.80 | −12.00 | −0.76 | 0.83 | 22.36 |
| Cgg [%] | 3.00 | −1.96 | −0.09 | 0.09 | 0.04 | −1.14 | 0.05 | 0.83 | 3.85 |
| Cov [%] | −0.28 | −0.46 | −0.55 | 0.50 | 0.30 | −3.93 | 0.06 | 0.83 | 4.13 |
| Vtlin [mV] | 17.60 | 15.40 | 16.00 | −28.00 | −2.50 | 13.20 | 1.00 | 0.34 | 42.05 |
| Idlin [%] | −3.20 | −4.06 | −4.10 | 6.80 | 1.45 | −9.78 | −0.56 | 0.83 | 13.73 |
| Vtsat [mV] | 25.60 | 12.60 | 18.50 | −30.00 | −3.00 | 19.20 | 2.00 | 0.34 | 49.38 |
| DIBL [mV] | −8.00 | 2.80 | −2.50 | 2.00 | 0.50 | −6.00 | −1.00 | 0.00 | 10.92 |
| Idsat [%] | −6.92 | −6.09 | −6.85 | 10.20 | 1.70 | −11.52 | −0.72 | 0.83 | 19.31 |
| SSsat [mV] | −0.42 | 1.01 | 0.36 | −0.15 | 0.09 | −0.45 | 0.01 | 0.00 | 1.25 |

The calculated statistical device metric variations based upon process variations can be used to create a model, for instance, in SPICE, by which circuits can be simulated as part of the design process.

Device metric variations can be used to derive the impact of each source variation on each device metric 208-0. With such information, an IC device or portion of such a device can be designed to take into account such high impact source variations 208-1. In addition or alternatively, transistor models can be improved using the device metrics 208-2 derived from process variations. Based on the improved transistor models, the SPICE model can be improved. Circuits can then be designed using such improved transistor models 208-3.

Figure 3A:
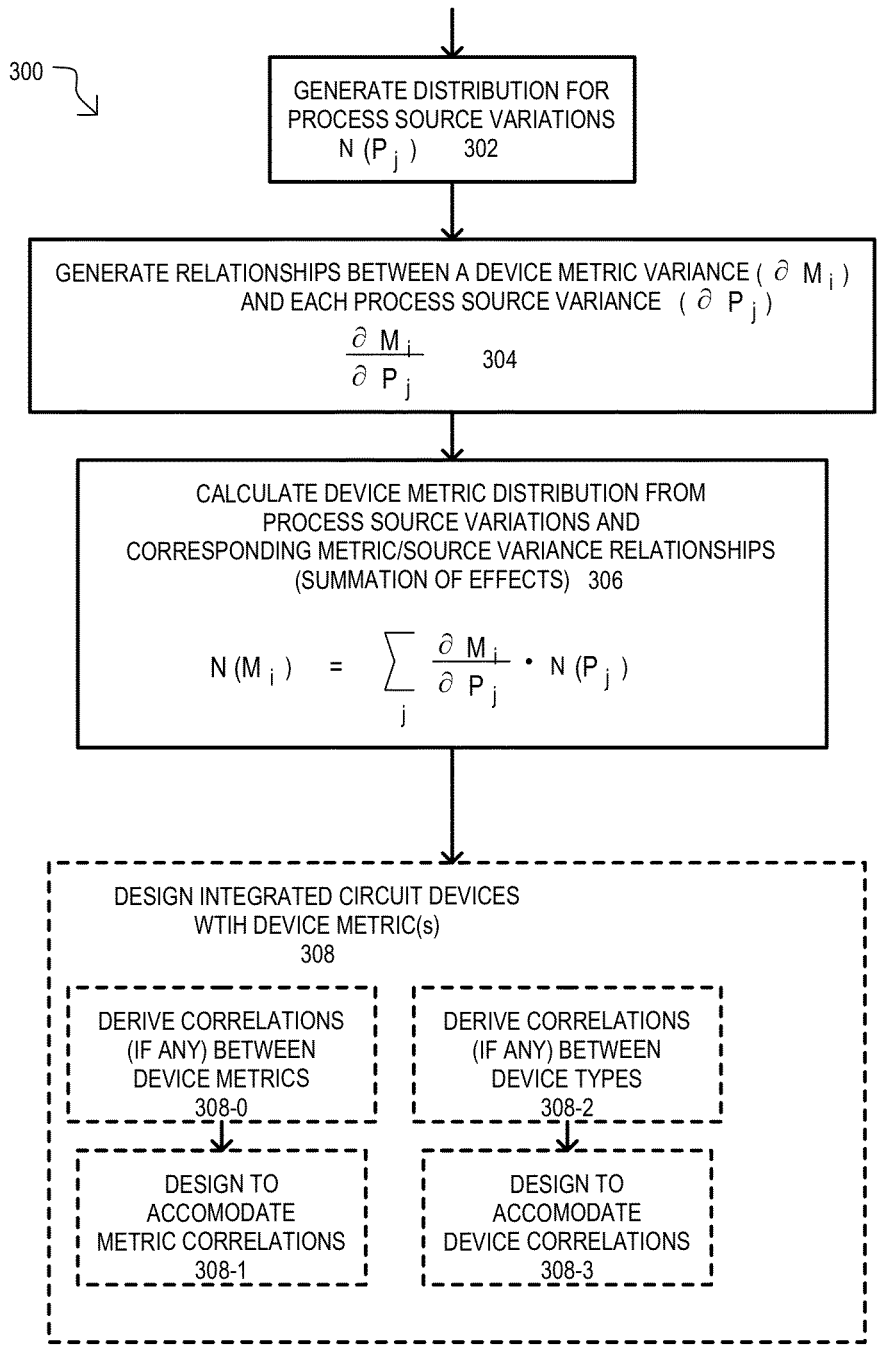
FIG. 3A is a flow diagram of a method according to a further embodiment.

FIG. 3A is a flow diagram of a method (300) according to another embodiment. A method 300 can include generating distributions for process source variations (N($P_j$)) (302). In very particular embodiments, such distributions can be Gaussian distributions (with a median value of zero, and a 3-sigma variation based on sigma=$\Delta P_j/3$). Such a distribution can be generated in a manner like those described above (e.g., derived from initial fabrication process assumptions). Process source variations ($\Delta P_j$) can include any of those described for embodiments herein, or equivalents.

A method 300 can then include generating relationships between a device metric variance and each corresponding to each process source variance ($\partial M_i/\partial P_j$) (304). Such relationships can be extracted from TOAD, for example.

A method 300 can then calculate a device metric distribution (N($M_i$)) with the selected process source distributions and corresponding variance relationships ($\partial M_i/\partial P_j$) (306). In the embodiment shown, such an action can include generating a distribution of device metric values, each corresponding to a value from a process source distribution and the corresponding variance relationship ($\partial M_i/\partial P_j$). In particular embodiments, metric distributions N($M_i$) can be based on Gaussian distributions for process variations and the metric distributions can be derived using a Monte-Carlo statistical approach.

Once all desired device metric distributions have been generated, the device metric distributions can be used to facilitate circuit design 308, for instance, to create a model for circuit simulation.

Figure 3B:
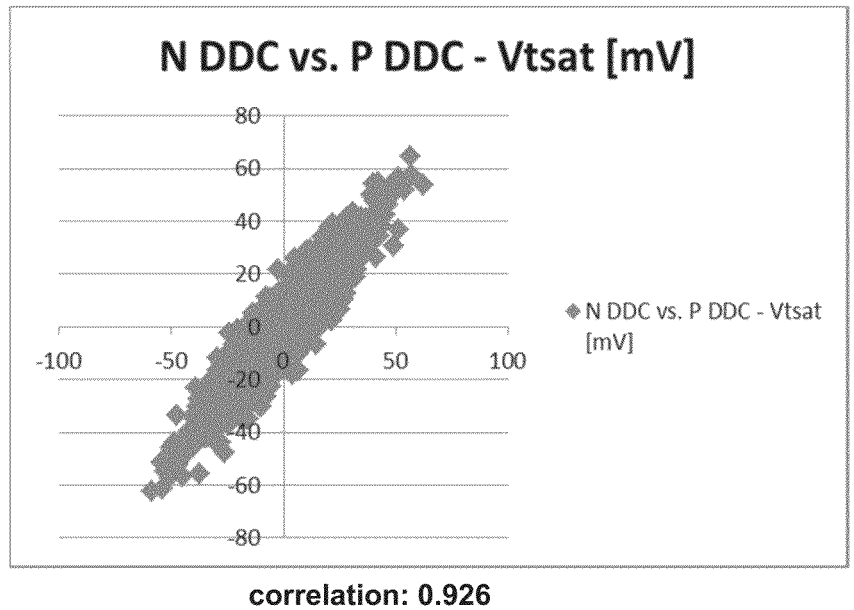
FIGS. 3B and 3C are graphs showing derived correlations between device metrics according to very particular embodiments.
Figure 3C:
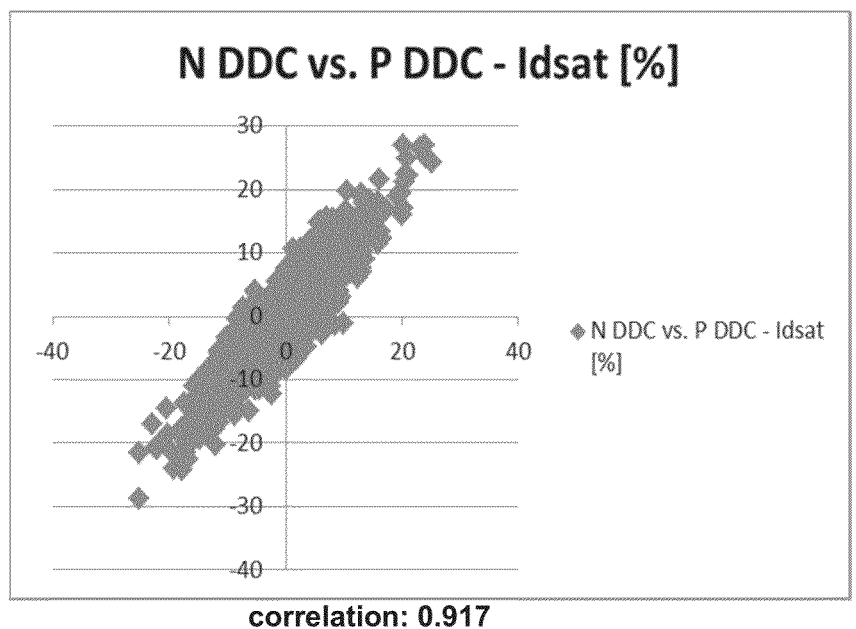

In the very particular embodiment shown, device metric distributions can be analyzed to determine correlations (if any) between device metrics 308-0. In one very particular embodiment, such an action can include calculating a correlation coefficient between different distributions. For instance, the correlation between saturation threshold voltage or saturation drive current between transistor types (e.g., n-channel FETs and p-channel FETs) can be determined, as shown by example in FIGS. 3B and 3C for a 28 nm process node with drawn gate length of 36 nm.

With such information, a circuit can be designed with better accuracy with the correlations between devices understood 308-1. The procedure of calculating correlations can be repeated for various metrics to further refine a circuit design 308-2 and 308-3, for instance, by iterating on the choice of devices for the different nodes of a circuit.

Figure 4:
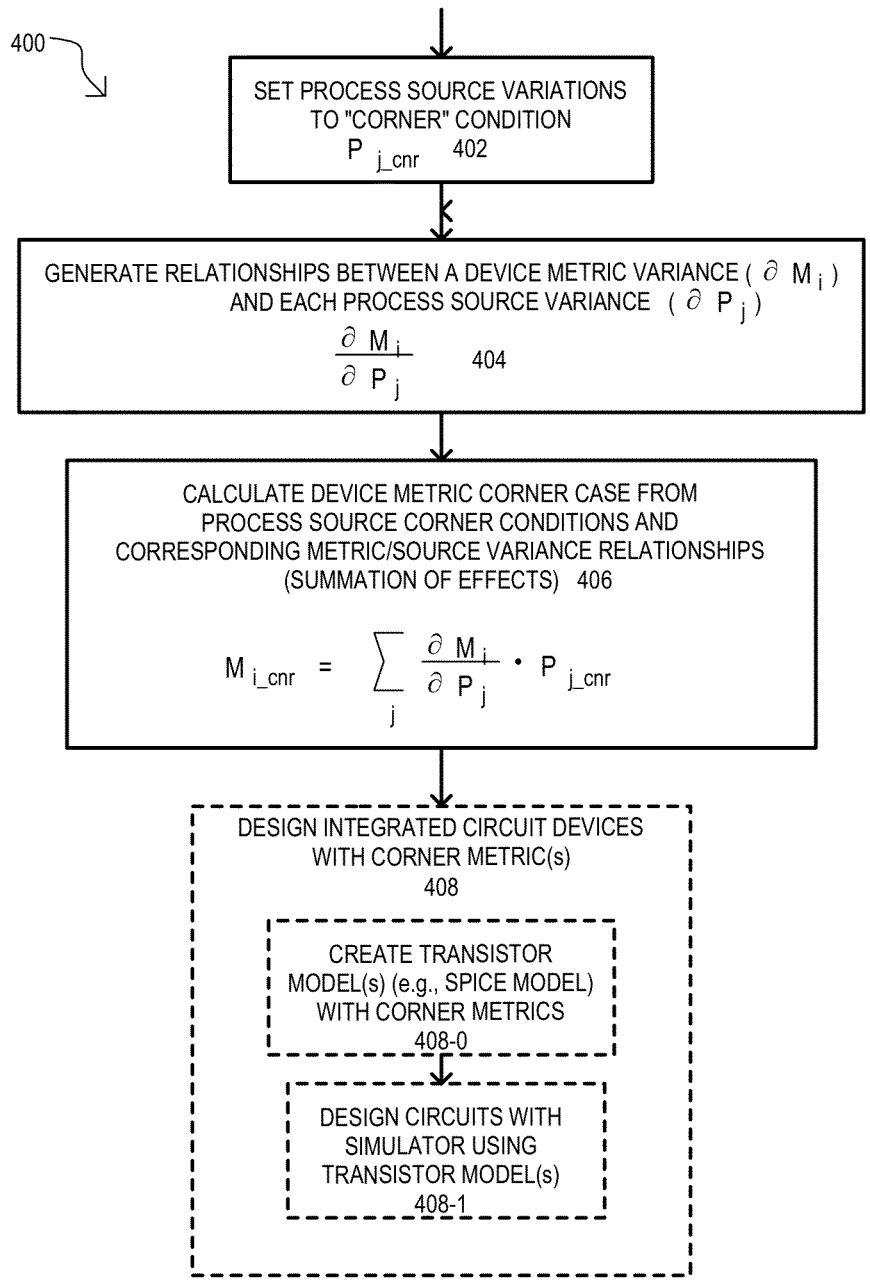
FIG. 4 is a flow diagram of a method according to a further embodiment.

FIG. 4 is a flow diagram of a method (400) according to another embodiment. A method 400 can include generating "corner" process source values ($P_{j\_cnr}$) (402). Corner process source values can be values that lead to a device metric extreme. Thus, for each possible process source variation range ($\Delta P_j$) it is known (or can be derived) which direction (e.g., leading to a 'faster' device or a 'slower' device than the nominal case) represents a corner condition for a given set of device metrics. Corner process source values ($P_{j\_cnr}$) typically represent process parameter shifts to cause resulting devices to behave at the corners of the metric window.

A method 400 can include generating relationships between a device metric variance and its correspondence to each process source variance ($\partial M_i/\partial P_j$) (404), for which the process source variances can be extracted from a tool, such as TCAD for example. A method 400 can then calculate a corner device metric ($M_{i\_cnr}$) for selected process source variances variance relationships to achieve device behavior at the corners (406).

Once all desired device metric corners have been generated, the device metrics can be used to facilitate circuit design based on corners 408.

In the very particular embodiment shown, corner device metrics can be incorporated into transistor models of circuit simulators (e.g., SPICE models) and/or simulator operation 408-0. Circuits can then be designed using such transistor models 408-1. A benefit of this methodology is that device metric corner cases can be predicted based on process source variances and using models for correlating process source variances with device metrics. For instance, increased channel implant dosage results in a device having increased threshold voltage. When the methodology as embodied herein is used in the case of devices having reliable operating characteristics, and wherein the devices enjoy improved variation in threshold voltage, as well as stronger drive current and reduced DIBL, a SPICE model representing corners that are pulled-in from conventional windows can be created. Circuits can be simulated based upon the more aggressive SPICE model, thereby enabling greater options for circuit power, sizing, speed and other options.

Figure 5:
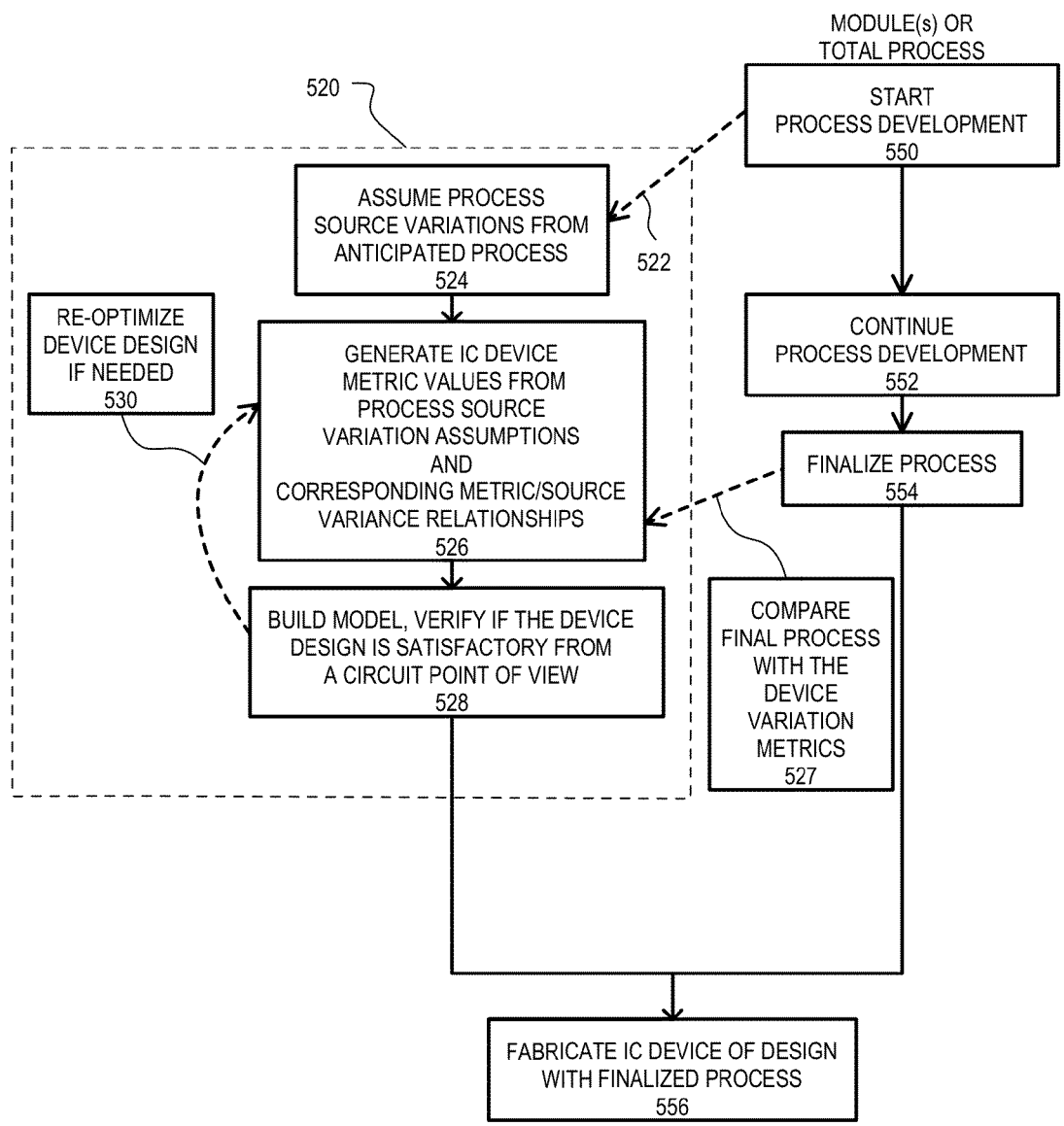
FIG. 5 is a flow diagram of a method according to a further embodiment.

FIG. 5 is a flow diagram of a method 520 according to another embodiment. A method 500 includes designing an IC device as a corresponding fabrication process is being developed. A method 520 includes assuming process source variations from expected fabrication process steps (524). Preferably, such assumptions can be made at the start of a fabrication process development 550. A method 520 can generate IC device metric values from process source variation assumptions and corresponding metric/source variance relationships 526, preferably by extracting the derivative relationship between device metric and process variation with a tool, such as TCAD. The device metrics values can then be used to make a preliminary circuit design 528. It is noted that such actions can occur while a fabrication process is still being developed (e.g., 552). The steps can go through iterative loops 530 to refine the device metrics based upon circuit simulations. The fabrication process development continues to proceed, using inputs from the device metric updates as necessary to compare against updates to device variation metrics 527. When the process is finalized 554, then a final set of device metric values can be calculated based upon a finalized set of process source variations 526, using silicon data as necessary. The final device metric values are fed into circuit simulation models. Final refinements can be made to circuit designs using the circuit simulation models that are fitted to the final device metric values. The final integrated circuit can then be fabricated with the finalized process (556).

Figures 6, 7:
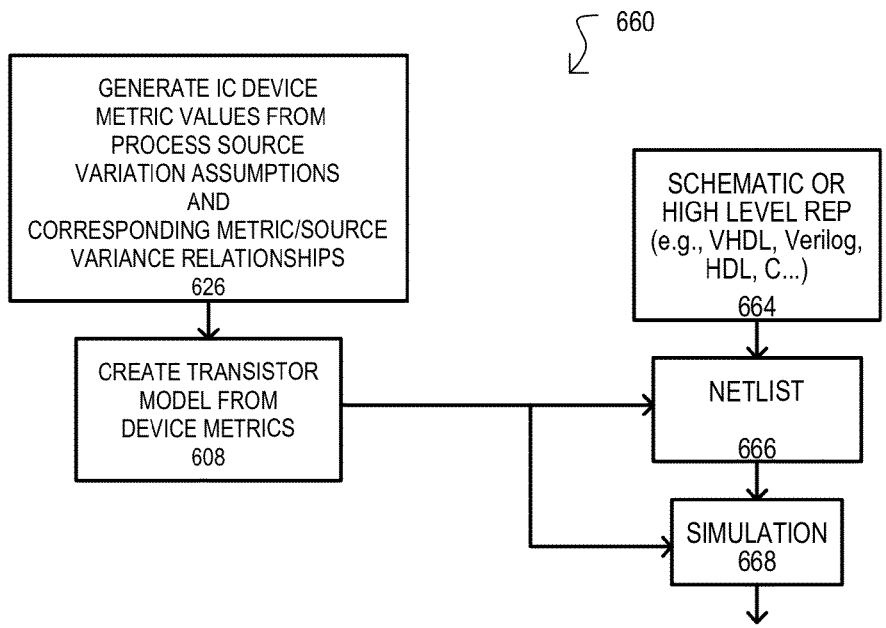
FIG. 6 is a flow diagram of a method according to an additional embodiment.
FIG. 7 is a diagram of a model and model elements according to an embodiment.

Referring now to FIG. 6, a method of designing an integrated circuit according to another embodiment is shown in a flow diagram and designated by the general reference character 660.

A method 660 can include creating an architectural representation of an integrated circuit (or portion thereof) in a higher level form. In the method of FIG. 6, the integrated circuit can be instantiated in a high level block schematic form and further described in a higher level design language (664).

A method 660 can also include generating a more detailed (i.e., lower level) representation of the design described by interconnected circuit blocks. In FIG. 6, this step can include generating a netlist (step 666). Such a netlist can include higher order representations of circuit blocks interconnected to one another by nets.

Method 660 can also include generating device metric values (626) for each of the components of the netlist using statistical variation of process parameters, preferably according to any of the embodiments described herein. Circuit simulation models (SPICE) can then be created from such device metric values (608). The device metric values can be input a transistor simulation tool such as TCAD, to derive a set of structural and process parameters for the associated transistor device. Then, the appropriate adjustments could be made to the transistor design, for instance, longer gate length, or higher dose of implanted material to set threshold voltage. The result of starting with the device metric values can be an improved transistor design. Improved transistor design can be fed back into the method to derive an updated set of device metrics. The updated set of device metrics can be used to update the models for SPICE, by which updated simulations (668) of the circuits can be produced.

Referring now to FIG. 7, one particular example of a netlist is shown in text form. A netlist 770 can include declarations of element types. In the particular example shown, element types can include nfet declarations 772 and pfet declarations 774. Such elements (772/774) can have variables based on device metrics generated as shown in embodiments herein. In addition or alternatively, such elements can be processed by simulation software according to such device metrics.

Transistor types (e.g., 772/774) can be conventional transistors, DDC transistors, or any other transistor types. A benefit of using a DDC transistor is, among other things, in the ability to pull in design corners and using the methods of the embodiments contemplated herein to refine the fabrication and create improved circuit simulation models.

Figure 8A:
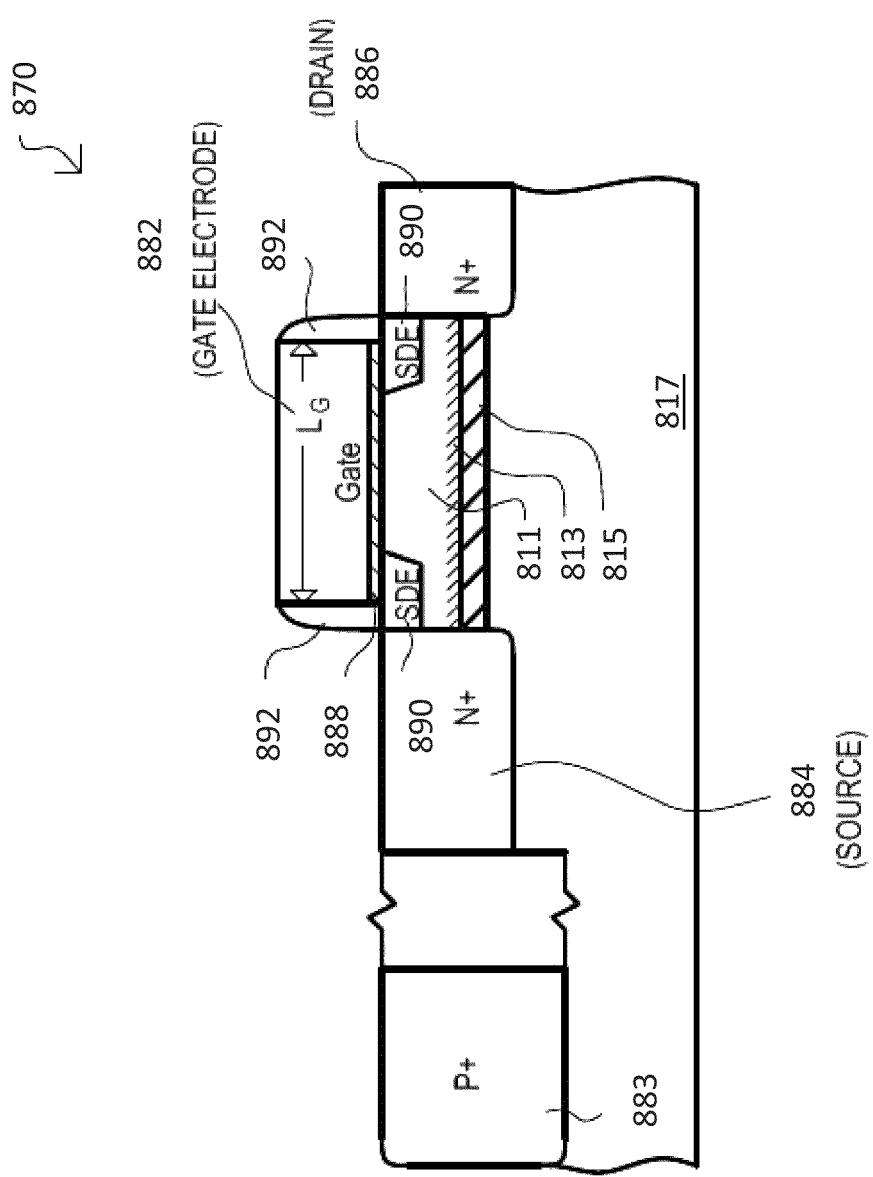

FIG. 8A shows a DDC type transistor 870 for which device metrics can be generated, according to embodiments. A DDC transistor 870 can be configured to have an enhanced body coefficient, along with the ability to set a threshold voltage (Vt) with enhanced precision. A DDC transistor 870 can include a gate electrode 882, source 884, drain 886, and a gate dielectric 888 positioned over a substantially undoped channel 811. Optional lightly doped source and drain extensions (SDE) 890 can be positioned respectively adjacent to source 884 and drain 886. Such extensions 890 can extend toward each other, reducing effective length of the substantially undoped channel 811.

In FIG. 8A, the DDC transistor 870 is shown as an n-channel transistor having a source 884 and drain 886 made of n-type dopant material, formed upon a substrate such as a p-type doped silicon substrate providing a p-well 817. In addition, the n-channel DDC transistor 870 in FIG. 8A can include a highly doped screening region 815 made of p-type dopant material, and a threshold voltage set region 813 made of p-type dopant material.

Further descriptions of a DDC transistor as well as an exemplary fabrication process and other aspects of a DDC transistor can be found in U.S. Pat. No. 8,273,617, titled "Electronic Devices and Systems, and Methods for Making and Using the Same." A DDC transistor provides advantages for circuit design in that, among other reasons, a DDC transistor enables designs having pulled-in corners. The reason is the tighter distribution of the threshold voltage from device-to-device. Additionally, a DDC transistor includes a strong body coefficient by which body biasing can be used to further pull in design corners. A result of using a DDC transistor is the ability to implement improved integrated circuit designs according to desired targets for power and performance whereas when using conventional transistors circuit designers resort to designing conservatively for wider design corners thereby sacrificing the potential power and performance that could be otherwise achieved for a design. An advantage of using a DDC transistor as part of implementing on the embodiments described herein is in the ability to reliably design integrated circuits using a statistically-based, process variation-comprehending simulation model by which design corners could be shrunk.

FIG. 8B shows a FinFET type transistor 870-B for which device metrics can be generated, according to additional embodiments. The FinFET transistor 870-B can include a gate electrode 882-B and gate dielectric 888-B that surround a substantially undoped channel 811-B on opposing sides. The view of FIG. 8B is taken along a channel length. Thus, it is understood that source and drain regions can extend into and out of the view shown.

FIG. 8C shows a FinFET type transistor 870-C having a screening region 815-C, for which device metrics can be generated according to further embodiments. As in the case of FIG. 8A, the FinFET transistor 870-C has a screening region that can be configured to have an enhanced body coefficient, along with the ability to set a Vt with enhanced precision. The transistor 870-C includes a gate electrode 882-C and gate dielectric 888-C formed over a substantially undoped channel 811-C on opposing sides. However, unlike FIG. 8B, a highly doped screening region 815-C can be formed in a substrate 819 below substantially undoped channel 811-C. Optionally, a Vt set region 813-C can be formed between the screening region 815-C and substantially undoped channel 811-C.

As in the case of FIG. 8B, the view of FIG. 8C is taken along a channel length, and source and drain regions can extend into and out of the view, separated from screening region 815-C by portions of undoped channel region 811-C.

The geometries of transistor 870-B can be the source of additional process source variations, not included for metrics of conventional transistors. Further, the geometries of transistor 870-C, as well as the Vt set region and screening region, can be the subject of process source variations for metrics of such a transistor.

As noted above, the various methods and models according to embodiments can be utilized to generate device metrics for other transistor types (e.g., conventional MOSFETs, BJTs, JFETs, etc.).

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
assuming variation among process targets for a plurality of integrated circuit (IC) fabrication process sources of variation;
deriving relationships between each process source variance of the IC fabrication process and a device metric variance by operation of a computer program executed by a computer, the device metric variance being a variance in an IC performance characteristic;
generating a predicted device metric variation by at least multiplying each process source variation by the corresponding relationships between its process source variance and the device metric variance; and
designing at least a portion of an integrated circuit with the predicted device metric variation; wherein.
generating the predicted device metric variation includes
calculating a root sum square of process source variations and the relationships between the corresponding process source variance and the device metric variance;
designing the at least a portion of the integrated circuit includes selecting process source variations having a greatest effect on the predicted device metric variation and creating a transistor performance model from at least the device metric; and
fabricating the at least a portion of the integrated circuit with the predicted device metric variation.

2. The method of claim 1, wherein:
the relationships are generated from a semiconductor design automation tool executed by the computer.

3. The method of claim 2, wherein:
the relationships are generated from a technology computer aided design (TCAD) automation tool.

4. The method of claim 1, wherein:
the assumed variation values correspond to an IC fabrication process still under development.

5. A method, comprising:
assuming variation among process targets for a plurality of integrated circuit (IC) fabrication process sources of variation;
deriving relationships between each process source variance of the I C fabrication process and a device metric variance by operation of a computer program executed by a computer, the device metric variance being a variance in an I C performance characteristic;
generating a predicted device metric variation by at least multiplying each process source variation by the corresponding relationships between its process source variance and the device metric variance; and
designing at least a portion of an integrated circuit with the predicted device metric variation; wherein
generating the predicted device metric variation includes
generating a device metric distribution from process source variation distributions and the relationships between the corresponding process source variance and the device metric variance;
designing the at least a portion of the integrated circuit includes any selected from the group consisting of: deriving correlations between device metrics and deriving correlations between device types; and
fabricating the at least a portion of the integrated circuit with the predicted device metric variation.

6. The method of claim 5, wherein:
the relationships are generated from a semiconductor design automation tool executed by the computer.

7. The method of claim 6, wherein:
the relationships are generated from a technology computer aided design (TCAD) automation tool.

8. The method of claim 5, wherein:
the assumed variation values correspond to an IC fabrication process still under development.

9. A method, comprising:
assuming variation among process targets for a plurality of integrated circuit (IC) fabrication process sources of variation;
deriving relationships between each process source variance of the IC fabrication process and a device metric variance by operation of a computer program executed by a computer, the device metric variance being a variance in an IC performance characteristic;
generating a predicted device metric variation by at least multiplying each process source variation by the corresponding relationships between its process source variance and the device metric variance; and designing at least a portion of an integrated circuit with the predicted device metric variation; wherein generating the predicted device metric variation includes generating a corner device metric corresponding to corner process source values, the corner process source values corresponding to an extreme end of a range of possible process source values;

designing the at least a portion of the integrated circuit includes designing a transistor model with at least the corner device metric; and fabricating the at least a portion of the integrated circuit with the predicted device metric variation.

10. The method of claim 9, wherein:

the relationships are generated from a semiconductor design automation tool executed by the computer.

11. The method of claim 10, wherein:

the relationships are generated from a technology computer aided design (TCAD) automation tool.

12. The method of claim 9, wherein:

the assumed variation values correspond to an IC fabrication process still under development.

* * * * *